US009236493B2

(12) United States Patent
Oh et al.

(10) Patent No.: US 9,236,493 B2
(45) Date of Patent: Jan. 12, 2016

(54) P-TYPE TRANSPARENT OXIDE SEMICONDUCTOR, TRANSISTOR HAVING THE SAME, AND MANUFACTURE METHOD OF THE SAME

(71) Applicant: KOREA INSTITUTE OF SCIENCE AND TECHNOLOGY, Seoul (KR)

(72) Inventors: Young-Jei Oh, Seoul (KR);
Chil-Hyoung Lee, Jeollabuk-do (KR);
Won-Kook Choi, Seoul (KR);
Jeon-Kook Lee, Gyeonggi-do (KR);
Young-Soo No, Daejeon (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 214 days.

(21) Appl. No.: 13/659,226

(22) Filed: Oct. 24, 2012

(65) Prior Publication Data
US 2013/0292668 A1    Nov. 7, 2013

(30) Foreign Application Priority Data

May 17, 2012 (KR) ........................ 10-2012-0052679

(51) Int. Cl.
*H01L 29/10* (2006.01)
*H01L 29/786* (2006.01)
*H01L 29/66* (2006.01)

(52) U.S. Cl.
CPC .... *H01L 29/78693* (2013.01); *H01L 29/66969* (2013.01)

(58) Field of Classification Search
CPC ..................... H01L 21/02565; H01L 29/7869; H01L 51/442

USPC .................................. 420/557; 257/43; 423/1
See application file for complete search history.

(56) References Cited

U.S. PATENT DOCUMENTS

2003/0218221 A1*  11/2003  Wager et al. ................... 257/410
2010/0090216 A1*   4/2010  Ferrao De Paiva Martins et al. ............................. 257/43
2012/0118386 A1*   5/2012  Chen et al. ..................... 136/265

(Continued)

FOREIGN PATENT DOCUMENTS

JP    2011-009619 A    1/2011
KR   1020090086581 A   8/2009

(Continued)

OTHER PUBLICATIONS

Korean Notice of Allowance dated Jun. 26, 2013; Appln. No. 10-2012-0052679.

(Continued)

*Primary Examiner* — Douglas Menz
(74) *Attorney, Agent, or Firm* — Ladas & Parry LLP

(57) ABSTRACT

A p-type transparent oxide semiconductor includes tin oxide compounds represented by below chemical formula 1:

$$Sn_{1-x}M_xO_2 \quad \text{[Chemical Formula 1]}$$

wherein, in the chemical formula 1, the M is tri-valent metal and the X is a real number of 0.01~0.05. The p-type transparent oxide semiconductor is applicable to active semiconductor devices such as TFT-LCD and transparent solar cell, due to excellent electrical and optical properties and shows superior properties in aspects of visible light transmittance (T), carrier mobility ($\mu$) and rectification ratio as well as transparency.

16 Claims, 3 Drawing Sheets

(56) References Cited

U.S. PATENT DOCUMENTS

2012/0192936 A1* 8/2012 Girt et al. .................. 136/255
2013/0075740 A1* 3/2013 Correia Fortunato et al. .. 257/63

FOREIGN PATENT DOCUMENTS

| KR | 10-1073542 B1 | 10/2011 |
| KR | 1020110109066 A | 10/2011 |

OTHER PUBLICATIONS

Kenji Nomura, et al; "Thin-Film Transistor Fabricated in Single-Crystalline Transparent Oxide Semiconductor", Science, vol. 300, May 23, 2003; pp. 1269-1272.

Doo-Hyoung Lee, et al; "Inkjet printed high-mobility indium zinc tin oxide thin film transistors", Journal of Materials Chemistry, Apr. 17, 2009, pp. 3135-3137.

Sunho Jeong, et al; "Solution-Processed Zinc Tin Oxide Semiconductor for Thin-Film Transistors", The Journal of Physical Chemistry Letters, Published on Web Jul. 8, 2008, vol. 112, pp. 11082-11085.

Sang-Yun Sung, et al; "Fabrication of p-channel thin-film transistors using CuO active layers deposited at low temperature", Appl. Phys. Lett. vol. 97, Published Online Nov. 30, 2010; pp. 222109-1-22109-3.

Elvira Fortunato, et al; "Thin-film transistors based on p-type Cu2O thin films produced at room temperature", Applied Physics Letters, Published Online May 10, 2010; vol. 96, pp. 192102-1-192102-3.

Yoichi Ogo, et al; "p-channel thin-film transistor using p-type oxide semiconductor, SnO", Applied Physics Letters, Published Online Jul. 25, 2008; vol. 93, pp. 032113-1-032113-3.

Elvira Fortunato, et al; "Transparent p-type SnOx thin film transistors produced by reactive rf magnetron sputtering followed by low temperature annealing", Applied Physics Letters, Published Online Aug. 4, 2010; vol. 97, pp. 052105-1-052105-3.

Chil-Hyoung Lee, et al; "P-type Mn-doped $SnO_2$ oxide semiconductor materials prepared by a sol-gel method", The Korean Ceramic Society; 1 page; Oct. 25, 2011.

Chil-Hyoung Lee, et al; "Fabrication and Electrical Characteristic of Mn:$SnO_2$ oxide thin-films for gas sensor application", 1 page, Nov. 4, 2011; The Korean Sensors Society.

Chil-Hyoung Lee, et al; "P-type transparent Mn doped Tin oxide thin-films by sputtering condition", The Korean Ceramic Society, 1 page; Apr. 19, 2012.

* cited by examiner

P-TYPE TRANSPARENT OXIDE SEMICONDUCTOR, TRANSISTOR HAVING THE SAME, AND MANUFACTURE METHOD OF THE SAME

CROSS-REFERENCE TO RELATED APPLICATION

The present disclosure relates to subject matter contained in priority Korean Application No. 10-2012-0052679, filed on May 17, 2012, which is herein expressly incorporated by reference in its entirety.

BACKGROUND OF THE INVENTION

1. Field of the Invention

The present disclosure relates to a transparent oxide with p-type having semiconductivity which can be used as active semiconductor devices such as TFT-LCD and transparent solar cell and a manufacture method of the same, particularly relates to TFT (Thin Film Transistor) of p-type transparent oxide semiconductor with new composition featured by remarkably superior properties such as visible light transmittance (T), carrier mobility (μ), and rectification ratio, and manufacture method of the same.

2. Background of the Invention

Although amorphous silicon (Si) is mainly used in the TFT (Thin Film Transistor) used for electric device currently, it has some disadvantages that switching speed is slow due to low carrier mobility and high temperature process is required in manufacturing thin film, compared with oxide semiconductor.

In addition, optical devices applying optical function need development of TFT (Thin Film Transistor) using a new p-type transparent oxide because of restrictions such as opacity caused by small band-gap originally possessed by the amorphous silicon.

Amorphous transparent oxide semiconductor (TOS) is capable of low temperature process, advantageous to epitaxy due to very low surface roughness from small particle size, and proper to micro-patterning including lithography process. Therefore, amorphous $InGaO_3(ZnO)_5$ (IGZO) series n-type channel materials (mobility at RT: >10 $cm^2/Vs$) has been developed and used as a part of TFT materials, until now. In order to manufacture active devices on flexible substrates such as semiconductor (inverters etc.), optical device (LED, LD etc.), and solar cell, it is required to develop of p-type oxide materials with excellent electric property of amorphous phase even at low temperature.

In the TFT development history, the oxide TFT announced by Phillips Research Institute in 1995 was a memory device manufactured by applying $SnO_2$ ferroelectrics as gate dielectrics, which was the beginning of oxide TFT related studies. Then, when using $InGaO_3(ZnO)_5$ material published by Hosono et al, Tokyo Institute of Technology, Japan as TFT channel, a device with 80 $cm^2/Vs$ of mobility and $10^5$ of $I_{on/off}$ ratio was obtained [Hosono, et al, Science, 300, p1269 (2003)]. However, this device had a problem to need high temperature heat treatment over 1400° C. The reason that this device had very rapid mobility in spite of amorphous film was reported that overlap of s-orbital wavefunction having smallest anisotrophy according to metal valence electron direction in the oxide contributed to band charge transfer of election.

Since the results of Hosono et al., researches to obtain a new p-type semiconductor material has been progressed, but in the most cases of them, vacuum equipment was used during the process to manufacture the oxide semiconductor. Although in this method, low temperature process was possible, it had still a disadvantage to use an expensive equipment. Therefore, it is clear helpful to cost reduction to manufacture oxide semiconductor TFT using solution process.

Recently, some research groups has manufactured thin films through sol-gel method, MOD (metal organic decomposition method), nano-particle dispersion solution method, and chemical bath deposition (CBD) after preparing precursor at first.

For the solution using precursor, it is possible to vary its crystallinity and mobility using one component, two component, and three component system. For instance, Chang et al., Oregon State University, US realized high mobility as much as 30 $cm^2/Vs$ with printing method. However, in this case there was a disadvantage that high off current ($I_{off}$) was not solved [Chang, et, al., J. Mater. Chem., 19, p. 3135 (2009)].

Like these, for materialization of TFT, the most researches has been based on organic semiconductor using solution process and the organic semiconductor TFT has been the first candidate as a next generation flexible display driving device for the last 10 years. However, the organic semiconductor TFT still has not solved difficult problems in terms of mobility, current density, confidence, and manufacturing process.

On the contrary, in case of the sol-gel oxide semiconductor process, its post heat treatment temperature is still higher in spite of several advantages and it is known that 500~600° C. of temperature is required in manufacturing ZnO thin film alone. As the sol-gel method is a process to form an inorganic network through hydrolysis of precursors at appropriate pH, coat a substrate with a solution containing the above, and then produce metal oxide through post heat treatment, main ingredients of pre-polymerized colloid phase are ceramic precursors, so it leaves room for lowering heat treatment temperature. In this case, metal alkoxide or metal acetate is commonly used as a precursor and the precursor compound should have high solubility, maintain stable solution-phase, and produce little amount of precipitate after heat treatment.

The sol coating consists of dip coating, spin coating, and spray coating and some cases to apply the sol for manufacturing an oxide semiconductor by ink-jet printing has been reported. For instance, Moon et al., manufactured sol-gel solution for Zn,Sn Oxide (ZTO) to use it as an ink for ink-jet, where the transistor manufactured by printing ZTO (Sn: 30 mol %) solution between source electrode and drain electrode obtained 0.01 $cm^2/Vs$ of mobility and $10^5$ of on/off current ratio. [J. H. Moon, et al., J. Phys. Chem. C, 112, p. 11082 (2008)]. In this case, although post heat treatment was performed at 500° C. by preparing sol-gel solution with 2-methoxyethanol and stabilizing agent by using zinc acetate dehydrate and tin acetate as source, it was determined that its mobility was low. Therefore on the basis of ZTO of which process was improved, a result that the mobility was improved to 0.1~0.5 $cm^2/Vs$ by measuring TFT property after heat treatment at 350~500° C. was published. Besides, another case to manufacture TFT through high temperature heat treatment after dip-coating or spin-coating of $Zn_{1-x}Mg_xO$ and $Zn_{1-x}ZrO$ sol gel solution for preparing a thin film was reported. Recently, a result to form $Zn_{0.97}Zr_{0.03}O$ thin film with sol-gel method at 300° C., relatively lower temperature as process temperature for TFT and demonstrate 4.1 inch QVGA TFT-LCD using this was published also and in this case, it was found that although Zinc acetate and zirconium propoxide were used as precursors, it resulted in properties such as 0.0042 $cm^2/Vs$ of mobility and 24.5V of Vth.

Because most oxide semiconductors which has been known until now shows n-type properties, if a transparent oxide semiconductor with p-type properties is materialized, it will be possible to manufacture CMOS type transparent electronic devices and there will be a lot of advantages for driving of OLED. Therefore, a research to seek p-type transparent oxide semiconductor material for transparent TFT devices is necessary.

SUMMARY OF THE INVENTION

An object of the present invention is to provide new composition of p-type transparent semiconductor, of which electric and optical properties are controllable depending on metal (M) ratio in a solid solution between p-type transparent semiconductor TFT using p-type tin oxide compound (M:SnO$_2$) with excellent mobility, on/off current ratio, and light transmittance and a representative tin oxide compound (M:SnO$_2$) in a compound group with Sn derived rutile structure, and a manufacture method of the same to solve problems of conventional TFT device technology described in the above.

In order to achieve the above object, a p-type transparent oxide semiconductor according to an example of the present invention includes tin oxide compounds represented by below chemical formula 1:

$$Sn_{1-x}M_xO_2 \quad \text{[Chemical Formula 1]}$$

wherein, in the chemical formula 1, the M is tri-valent metal and the X is a real number of 0.01~0.05.

The tin oxide compound may have a rutile structure where tin (Sn) position of the tin oxide is doped with the tri-valent metal (M).

The tri-valent metal (M) may include at least one selected from the group consisting of Rh, Al, Mn, Fe, Co, Cr, Ga, La, and a combination thereof.

A transistor according to another example of the present invention includes a gate substrate, an insulation layer located on the gate substrate, and a channel layer located on the insulation layer and including p-type oxide semiconductor, a source electrode and a drain electrode located on the insulation layer. Wherein, the source and the drain electrode are separated each other and the p-type transparent oxide semiconductor includes tin oxide compound represented by the chemical formula 1.

The channel layer may have a thickness of 50~200 nm.

The transistor may be a bottom gate or top gate structure.

A method to manufacture p-type transparent oxide semiconductor according to another example of the present invention includes solution preparing step to prepare precursor solution containing tin precursor and tri-valent metal precursor, coating step to form a precursor coating layer on a substrate using the precursor solution, and heat treatment step to obtain p-type transparent oxide semiconductor including tin oxide compounds represented by the chemical formula 1.

The precursor solution may include a stabilizing agent also and the stabilizing agent may control hydrolysis reaction of a precursor including tin precursor or tri-valent metal precursor.

The solution preparing step may further include heating and stirring step at 25~80° C. for 1~3 hr.

The heat treatment of the heat treatment step may be applied at 150~450° C. for 2~20 min.

The heat treatment of the heat treatment step may be performed in oxygen atmosphere.

The coating step may be performed using spin coating, dip coating, spray coating, or inkjet printing.

The precursor solution may include tri-valent metal (M) and tin (Sn) in the range of 0.01~0.05 by (mol of M)/(mol of M+mol of Sn).

The tri-valent metal precursor may include at least one selected from the group comprising metal acetate tetrahydrate (M(CH$_3$COO)$_2$.4H$_2$O, the M is tri-valent metal), metal acetate (M(CH$_3$COO)$_2$, the M is tri-valent metal), metal acetate dehydrate (M(CH$_3$COO)$_3$.2H$_2$O, the M is tri-valent metal), and a combination thereof.

The tin precursor may include at least one selected from the group comprising tin chloride dehydrate (SnCl$_2$:2H$_2$O), tin chloride (SnCl$_2$), tin chloride pentahydrate (SnCl$_4$:5H$_2$O), and a combination thereof.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

A p-type transparent oxide semiconductor according to an example of the present invention includes tin oxide compounds represented by below chemical formula 1:

$$Sn_{1-x}M_xO_2 \quad \text{[Chemical Formula 1]}$$

wherein, in the chemical formula 1, the M is tri-valent metal, the X is a real number of 0.01~0.05 and may be a real number of 0.01~0.03.

The p-type transparent oxide semiconductor has excellent visible light transmittance as well as excellent electrical properties in carrier mobility and rectification ratio, so has excellent usability as a p-type transparent semiconductor.

The tin oxide compound may have a rutile structure where tin (Sn) position of the tin oxide is doped with tri-valent metal (M). The tin oxide compound was made capable of post heat treatment at relatively lower temperature using not zinc oxide which is vulnerable to acid, but tin oxide which is acid incorriodible. In addition, the M is substituted for the position of tin to have a doped rutile structure and can materialize a transparent semiconductor with p-type properties.

The tri-valent metal (M) may include at least one selected from the group consisting of Rh, Al, Mn, Fe, Co, Cr, Ga, La, and a combination thereof. The p-type transparent oxide semiconductor has excellent conductivity and light transmittance, so can be applied to electronic devices such as semiconductor device. Especially, the p-type transparent oxide semiconductor not only can make up for disadvantages in carrier mobility, on/off ratio, and light transmittance that the conventional p-type amorphous oxide semiconductive materials has had, but also can be used as active devices such as a semiconductor on a flexible substrate (inverter, etc), an optical device (LED, LD, etc), and a solar cell, and particularly can be included in the channel layer of transistor desirably.

Figure 1:
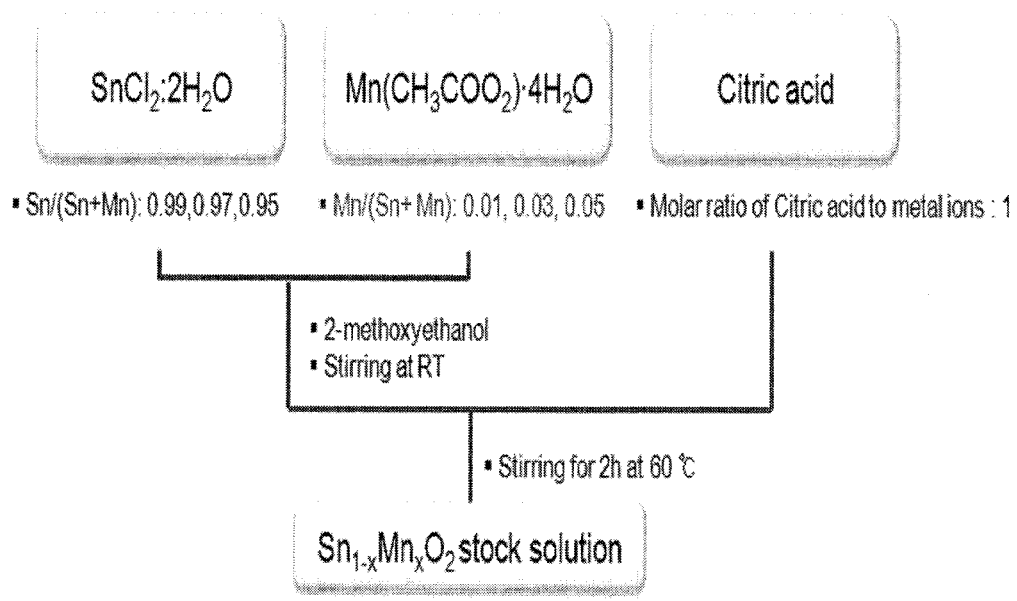
FIG. 1 is a manufacturing process chart of the precursor solution according to an example of the present invention.
Figure 2:
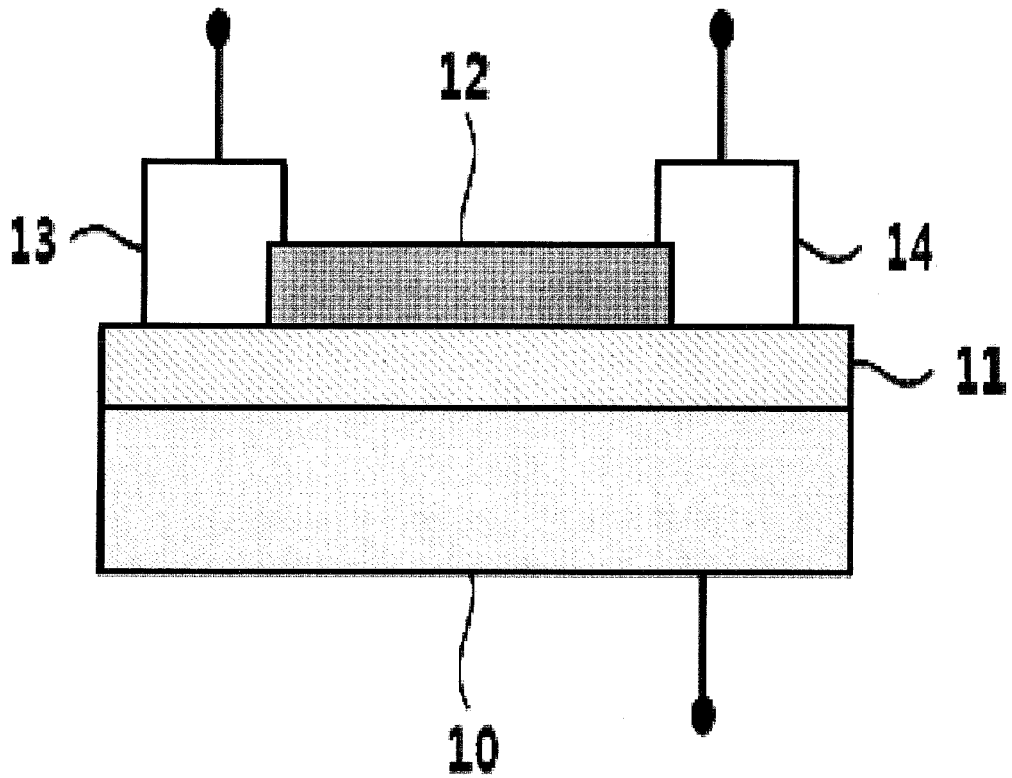
FIG. 2 is a cross section of thin film transistor according to an example of the present invention, which forms a p-type oxide semiconductor, a gate insulation layer, a source electrode, and a drain electrode.

FIG. 2 shows a cross section for a thin film transistor according to an example of the present invention, which forms a p-type oxide semiconductor, a gate insulation layer, a source electrode, and a drain electrode. Referring to FIG. 2, a transistor comprises a gate substrate (10), an insulation layer (11, gate insulation layer) located on the gate substrate (10), a channel layer (active oxide layer, 12) located on the insulation layer (11) which is including p-type oxide semiconductor, a source electrode (13) and a drain electrode (14) located on the insulation layer (11). Wherein, the source and the drain electrode are separated each other and the p-type transparent oxide semiconductor includes tin oxide compounds represented by the chemical formula 1:

$$Sn_{1-x}M_xO_2 \quad \text{[Chemical Formula 1]}$$

Descriptions on the chemical formula 1, the tin oxide compound represented by the chemical formula 1, and the p-type transparent oxide semiconductor are overlapped with what was described in the p-type transparent oxide semiconductor according to an example of the present invention, so their concrete description are omitted herein.

The gate substrate (10) may include glass, sapphire, silicon (Si), gallium arsenide (GaAs), silicon carbide (SiC), or a transparent plastic film.

The channel layer may have a thickness of 50~200 nm.

The transistor may be a bottom gate or a top gate structure.

The transistor includes a p-type transparent semiconductor including the tin oxide compound with excellent carrier mobility, on/off ratio, and light transmittance, so can provide a transparent TFT (thin film transistor) with excellent electric and optical properties.

A method to manufacture a p-type transparent oxide semiconductor according to another example of the present invention comprises solution preparing step, coating step, and heat treatment step.

The solution preparing step may comprise a step to prepare precursor solution containing tin precursor and tri-valent metal precursor.

The tri-valent metal (M) precursor may include at least one selected from the group comprising metal (M) acetate tetrahydrate $(M(CH_3COO)_2.4H_2O)$, metal acetate $(M(CH_3COO)_2)$, metal acetate dehydrate $(M(CH_3COO)_3.2H_2O)$, and a combination thereof. The metal M means tri-valent metal and may include at least one selected from the group consisting of Rh, Al, Mn, Fe, Co, Cr, Ga, La, and a combination thereof.

The tin precursor may include at least one selected from the group comprising tin chloride dehydrate $(SnCl_2:2H_2O)$, tin chloride $(SnCl_2)$, tin chloride pentahydrate $(SnCl_4:5H_2O)$, and a combination thereof.

The precursor solution may include tri-valent metal (M) and tin (Sn) in the range of 0.01~0.05 by (mol of M)/(mol of M+mol of Sn) and may include them in the range of 0.01~0.03 by (mol of M)/(mol of M+mol of Sn).

The precursor solution may include a solvent and alcohols can be applied as the solvent. Preferably, the alcohols may include at least one selected from the group comprising 2-methoyethanol, ethanol, cysteamine, and a combination thereof.

The precursor solution may include a stabilizing agent also and the stabilizing agent can control a hydrolysis reaction of a precursor including tin precursor or tri-valent metal precursors. Concretely, the stabilizing agent may include at least one selected from the group comprising citric acid, acetic acid and a combination thereof. In case that the precursor solution includes the stabilizing agent also, the precursor solution can maintain stable solution phase and preferably, the stabilizing agent may be included in 1:1~1:2 mol ratio with metal ion included the precursor solution.

The solution preparing step may comprise heating and stirring step at 25~80° C. for 1~3 hr. When stirring during heating the solution within the range of temperature and time, the precursors can be dissolved in the solvent sufficiently to accomplish reactions after that.

The coating step is a process to form a precursor coating layer using the precursor solution. The coating step may be performed using spin coating, dip coating, spray coating, or inkjet printing, but any method able to form the precursor can be applied without limit.

The heat treatment step may comprise a process to yield p-type transparent oxide semiconductor including tin oxide compounds represented by the below chemical formula 1 by performing heat treatment of the precursor coating layer:

$$Sn_{1-x}M_xO_2 \quad \text{[Chemical Formula 1]}$$

wherein, in the chemical formula 1, the M is tri-valent metal and the X is a real number of 0.01~0.05, and preferably may be a real number of 0.01~0.03.

Descriptions on the chemical formula 1, the tin oxide compound expresses in the chemical formula 1, and the p-type transparent oxide semiconductor are overlapped with what was described in the p-type transparent oxide semiconductor according to an example of the present invention, so their concrete description are omitted herein.

The heat treatment of the heat treatment step may be done at 150~450° C. for 2~20 min and may be done in oxygen atmosphere.

The heat treatment of the heat treatment step is a process to form a thin film by soft baking of the precursor coating layer, through which the p-type transparent oxide semiconductor including the tin oxide compounds represented by the chemical formula 1 can be formed to a form of thin film.

The method to manufacture the p-type transparent oxide semiconductor can form a semiconductor using sol-gel method and accomplish the heat treatment also at lower temperature than that of conventional cases rapidly. In addition, in case of using the sol-gel method and applying the spin coating, it is possible to form the coating layer on a large area in the wafer size at low cost. Therefore, it is possible to manufacture the p-type transparent oxide semiconductive thin film with a large area and at low cost. Moreover, because sol-gel method is used, it is possible to manufacture high purity p-type transparent oxide semiconductor compared with conventional methods such as solid phase synthesis.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

EXAMPLE

Manganese acetate tetrahydrate ($Mn(CH_3COO_2).4H_2O$)) and tin chloride dehydrate ($SnCl_2:2H_2O$) to 0.03 in their mol ratio, Mn/(Mn+Sn) are measured, and mix them with 2-methoxyethanol, a solvent, stirring the mixture at room temperature (about 25° C.) for about 2 hr. Then, added citric acid as a stabilizing agent to 1:1 of mol ratio with metal ion to the mixture, heat and stir them at 60° C. for 2 hr to prepare precursor solution.

The precursor solution was spreaded on a Si or glass substrate by spin coating at 3000 rpm for 30 sec, and performed soft baking on a hot plate at 300° C., for 10 min to form a precursor coating layer.

By heat treatment of the precursor coating layer, $Sn_{1-x}Mn_xO_2$ thin film (x=0.03) was obtained and the heat treatment were executed with RTA (Rapid Thermal Annealing) in oxygen atmosphere and maintained at 300° C. for 10 min.

FIG. 2 shows a cross-section of p-type transparent thin film transistor according to another example of the present invention. The thin film transistor is an example of thin film transistor with a bottom gate structure of which gate substrate (10) is located under a channel layer (12, active oxide layer). Referring to FIG. 2, a gate insulation layer (11) may be formed on the gate substrate. The gate insulation layer may be silicon oxide layer or silicon nitride layer or may be other material layer.

Property differences between the transistor manufactured to have the p-type transparent oxide semiconductor as the channel layer according to the example and a conventional transistor manufactured using CuO (Copper Oxide) or $SnO_x$ (Tin Oxide) were indicated in below Table 1.

Referring to the Table 1, the example obtained higher carrier mobility than conventional CuO, $Cu_2O$, SnO and $SnO_x$ and also improved ON/OFF ratio remarkably.

Figure 3:
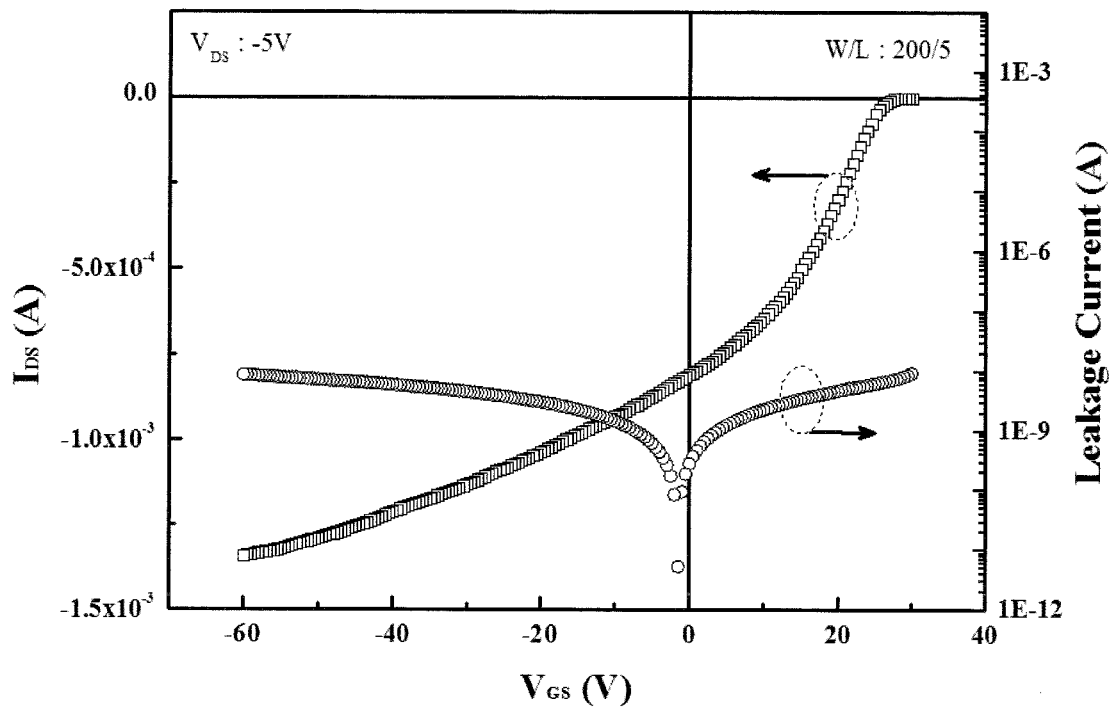
FIG. 3 is a graph showing a curve of gate voltage—drain current of a p-type thin film transistor using Sn$_{0.97}$Mn$_{0.03}$O$_2$ thin film (p-type transparent oxide semiconductor) manufactured according to an example of the prevent invention.
Figure 4:
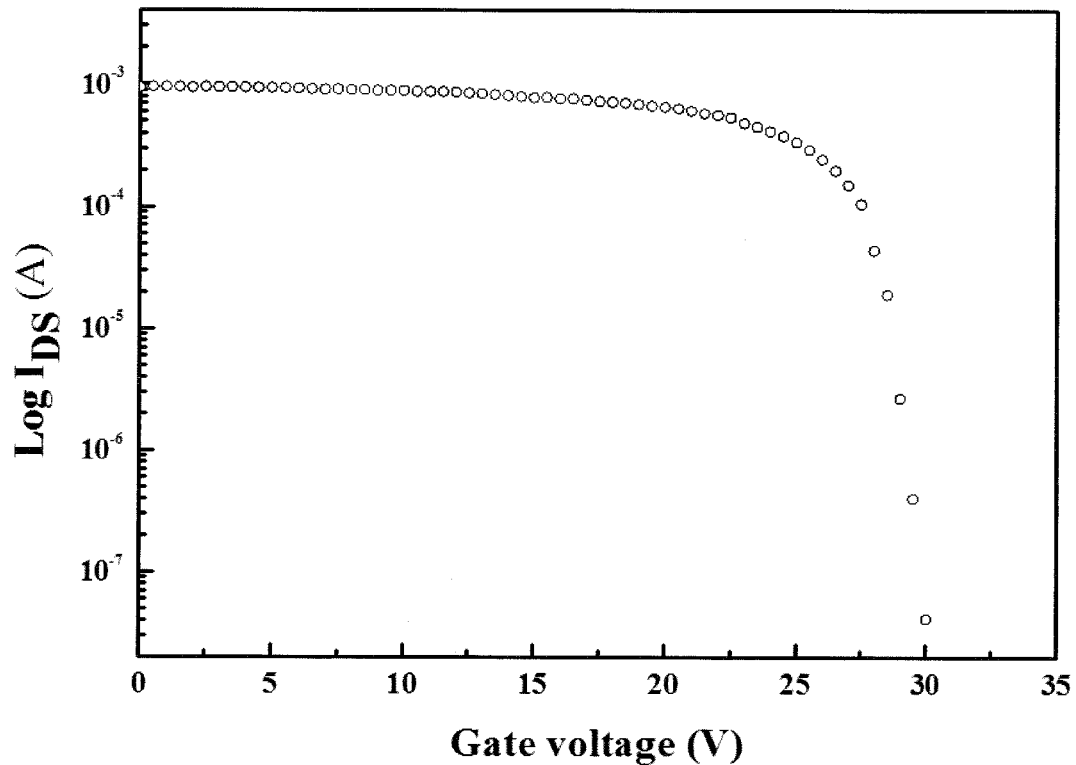
FIG. 4 is a graph showing a log curve of gate voltage—drain current of a p-type thin film transistor using Sn$_{0.97}$Mn$_{0.03}$O$_2$ thin film (p-type transparent oxide semiconductor) manufactured according to an example of the prevent invention.

FIG. 3 is a graph showing transfer property of the thin film transistor manufactured by the example of the present invention and concretely, shows drain-source current characteristics depending on change of gate voltage when $V_{DS}$ is −5V. FIG. 4 shows ON/OFF ratio of the thin film transistor manufactured according to the example of the present invention, as illustrated in the FIG. 3 and the value is $3.6 \times 10^4$, which has more excellent characteristics than that of other p-type oxide semiconductor having been known.

Figure 5:
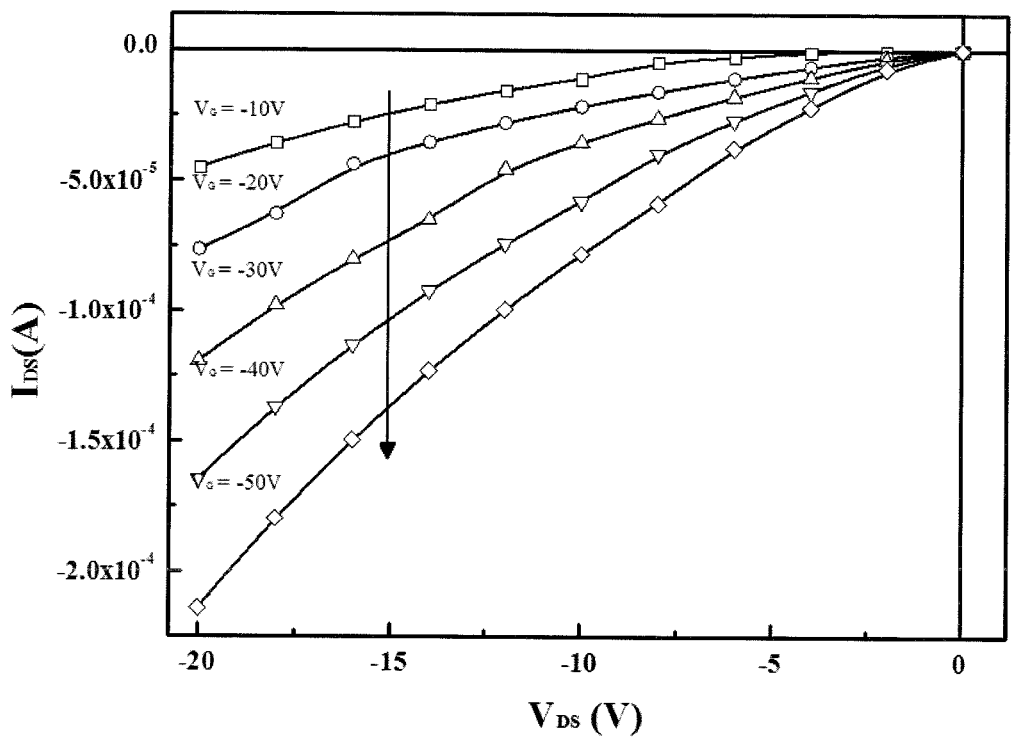
FIG. 5 is a graph showing a current curve according to drain voltage of a p-type thin film transistor using Sn$_{0.97}$Mn$_{0.03}$O$_2$ thin film (p-type transparent oxide semiconductor) manufactured according to an example of the prevent invention.
Figure 6:
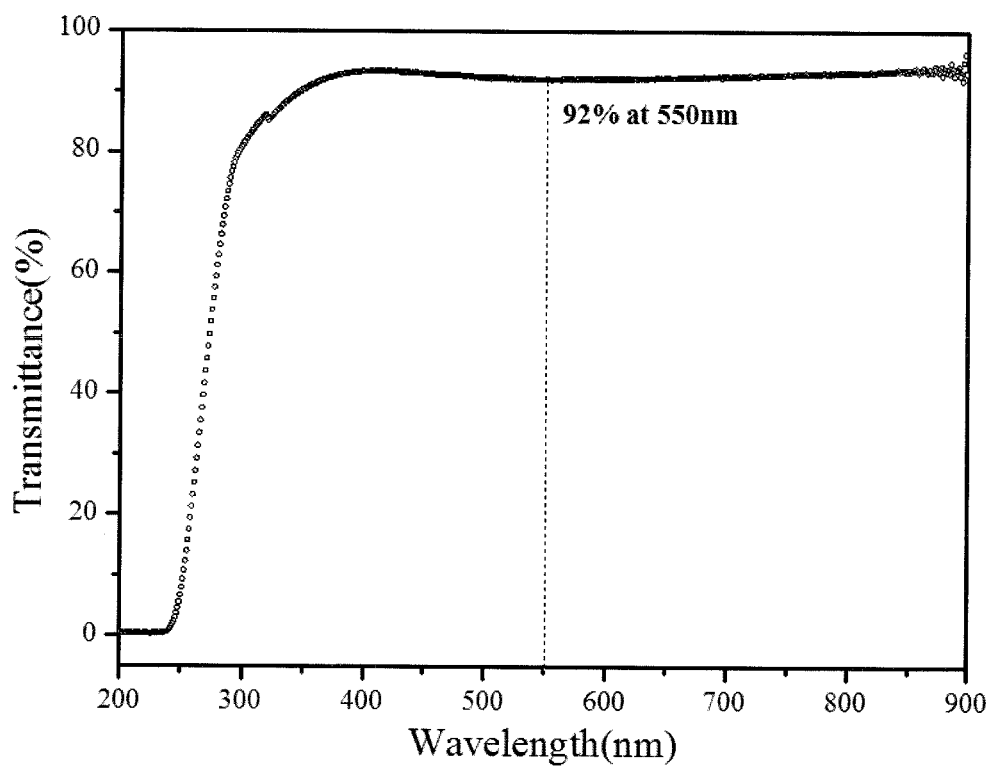
FIG. 6 is a graph showing light transmittance of Sn$_{0.97}$Mn$_{0.03}$O$_2$ thin film (p-type transparent oxide semiconductor) manufactured on a glass substrate according to an example of the prevent invention.

FIG. 5 is a graph relating to an oxide thin film transistor where source and drain are formed on a gate insulation layer without etching of the gate insulation layer and active region is formed between the source and the drain, which shows current values depending on gate voltage in case of impressing gate voltage as −10, −20, −30, −40 and −50V to the oxide thin film transistor. In addition, FIG. 6 is a graph showing light transmittance of a glass substrate on which MTO thin film is formed on the example of the present invention and it is found that it shows 92% of good transmittance at 550 nm wavelength.

When manufacturing MTO ($Mn:SnO_2$) thin film with spin coating method or sputtering method respectively, using $Sn_{1-x}M_xO_2$ (M=Mn, x=0.03) synthesized in the example of the present invention, it was found that transmittance of the heat treated thin film was about 92%, which was the best in the p-type transparent thin films having been known until now. It was shown also that its carrier mobility was 16.6 $cm^2/V·s$, which was improved more than 4 times, compared with 1~4 $cm^2/V·s$ of the conventional thin films and that the rectification ratio was $3.6 \times 10^4$, which was improved greatly compared with $10^2$~$10^3$ of the conventional value.

As this p-type transparent oxide semiconductor of the prevent invention has excellent electrical and optical properties, it is applicable to active semiconductor devices such as TFT-LCD, transparent solar cell, and Light Emitting Diode.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

TABLE 1

| | P-type semiconductor (thickness) | Gate insulation film (thickness) | ON/OFF Ratio | Mobility ($\mu_{FE}$) $cm^2/Vs$ | References |
|---|---|---|---|---|---|
| EXAMPLE | MTO (60 nm) | $SiO_2$ (200 nm) | $3.6 \times 10^4$ | 16.6 | Present Invention |
| Comparative Example 1 | CuO (300 nm) | $SiO_2$ (100 nm) | $\leq 10^4$ | 0.4 | APL 97, 222109 (2010) |
| Comparative Example 2 | $Cu_2O$ (40 nm) | $Al_2O_3/TiO_2$ (220 nm) | $2 \times 10^2$ | 3.9 | APL 96, 192102 (2010) |
| Comparative Example 3 | SnO (20 nm) | a-$Al_2O_x$ (210 nm) | $10^2$ | 1.3 | APL 93, 032113 (2008) |
| Comparative Example 4 | $SnO_x$ (30 nm) | $Al_2O_3/TiO_2$ (220 nm) | $\leq 10^3$ | 1 | APL 97, 052105 (2010) |

What is claimed is:

1. A p-type transparent oxide semiconductor including tin oxide compounds represented by below chemical formula 1:

$$Sn_{1-x}M_xO_2 \quad \text{[Chemical Formula 1]}$$

wherein, in the chemical formula 1, the M is tri-valent metal and the X is a real number of 0.01~0.05.

2. The p-type transparent oxide semiconductor according to claim 1,
wherein the tin oxide compound has a rutile structure where tin (Sn) position of the tin oxide is doped with tri-valent metal (M).

3. The p-type transparent oxide semiconductor according to claim 1,
wherein tri-valent metal (M) include at least one selected from the group consisting of Rh, Al, Mn, Fe, Co, Cr, Ga, La, and a combination thereof.

4. A transistor comprising a gate substrate,
a insulation layer located on the gate substrate,
a channel layer including p-type oxide semiconductor and located on the insulation layer,
a source electrode and a drain electrode located on the insulation layer:
wherein, the source and the drain electrode are separated each other and the p-type transparent oxide semiconductor includes tin oxide compound represented by chemical formula 1:

$$Sn_{1-x}M_xO_2 \quad \text{[Chemical Formula 1]}$$

wherein, in the chemical formula 1, the M is tri-valent metal and the X is a real number of 0.01~0.05.

5. The transistor according to claim 4, wherein the tri-valent metal (M) includes at least one selected from the group consisting of Rh, Al, Mn, Fe, Co, Cr, Ga, La, and a combination thereof.

6. The transistor according to claim 4, wherein the channel layer has a thickness of 50~200 nm.

7. The transistor according to claim 4, wherein the transistor is a bottom gate or a top gate structure.

8. A method to manufacture p-type transparent oxide semiconductor comprising:
solution preparing step to prepare precursor solution containing tin precursor and tri-valent metal precursor,
coating step to form a precursor coating layer on the substrate using the precursor solution, and
heat treatment step to yield p-type transparent oxide semiconductor including tin oxide compounds represented by the chemical formula 1;

$$Sn_{1-x}M_xO_2 \quad \text{[Chemical Formula 1]}$$

wherein, in the chemical formula 1, the M is tri-valent metal and the X is a real number of 0.01~0.05.

9. The method to manufacture p-type transparent oxide semiconductor according to claim 8, wherein the precursor solution includes a stabilizing agent which controls a hydrolysis reaction of precursor including tin precursor or tri-valent metal precursors.

10. The method to manufacture p-type transparent oxide semiconductor according to claim 8, wherein the solution preparing step may include heating and stirring step at 25~80° C. for 1~3 hr.

11. The method to manufacture p-type transparent oxide semiconductor according to claim 8, wherein the heat treatment of the heat treatment step is performed at 150~450° C. for 2~20 min.

12. The method to manufacture p-type transparent oxide semiconductor according to claim 8, wherein the heat treatment step is performed in oxygen atmosphere.

13. The method to manufacture p-type transparent oxide semiconductor according to claim 8, wherein the coating step is performed using spin coating, dip coating, spray coating, or inkjet printing.

14. The method to manufacture p-type transparent oxide semiconductor according to claim 8, wherein the precursor solution includes tri-valent metal (M) and tin (Sn) in the range of 0.01~0.05 by (mol of M)/(mol of M+mol of Sn).

15. The method to manufacture p-type transparent oxide semiconductor according to claim 8, wherein the tri-valent metal precursor includes at least one selected from the group comprising metal acetate tetrahydrate ($M(CH_3COO)_2 \cdot 4H_2O$, the M is tri-valent metal), metal acetate ($M(CH_3COO)_2$, the M is tri-valent metal), metal acetate dehydrate ($M(CH_3COO)_3 \cdot 2H_2O$, the M is tri-valent metal), and a combination thereof.

16. The method to manufacture p-type transparent oxide semiconductor according to claim 8, wherein the tin precursor includes at least one selected from the group comprising tin chloride dehydrate ($SnCl_2 \cdot 2H_2O$), tin chloride ($SnCl_2$), tin chloride pentahydrate ($SnCl_4 \cdot 5H_2O$), and a combination thereof.

* * * * *